United States Patent
Chang et al.

(10) Patent No.: US 7,078,315 B2
(45) Date of Patent: Jul. 18, 2006

(54) METHOD FOR ELIMINATING INVERSE NARROW WIDTH EFFECTS IN THE FABRICATION OF DRAM DEVICE

(75) Inventors: Ming-Cheng Chang, Tao-Yuan Hsien (TW); Tieh-Chiang Wu, I-Lan Hsien (TW); Yinan Chen, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 489 days.

(21) Appl. No.: 10/610,524

(22) Filed: Jul. 2, 2003

(65) Prior Publication Data

US 2005/0003608 A1 Jan. 6, 2005

(51) Int. Cl.
*H01L 21/76* (2006.01)
*H01L 21/38* (2006.01)
*H01L 21/22* (2006.01)

(52) U.S. Cl. .................. 438/435; 438/433; 438/434; 438/542; 438/561; 438/563

(58) Field of Classification Search .................. 438/424, 438/433–435, 542, 561, 563, FOR. 498, 438/589, 923, 702; 257/353–354
See application file for complete search history.

(56) References Cited

U.S. PATENT DOCUMENTS

| 5,684,313 | A | * | 11/1997 | Kenney | ...................... 257/296 |
| 5,913,132 | A | * | 6/1999 | Tsai | ........................... 438/434 |
| 6,465,325 | B1 | * | 10/2002 | Ridley et al. | ............... 438/428 |

* cited by examiner

*Primary Examiner*—Jennifer M. Kennedy
(74) *Attorney, Agent, or Firm*—Winston Hsu

(57) ABSTRACT

The present invention provides a method for eliminating inverse narrow width effects in the fabrication of DRAM devices. A semiconductor substrate is provided having thereon a shallow trench. The shallow trench surrounds an active area. A non-doped silicate glass (NSG) layer is deposited to fill the shallow trench, and is then etched back to a depth of the shallow trench, thereby exposing a portion of the semiconductor substrate at an upper portion of the shallow trench. A doped dielectric layer is deposited over the remaining NSG layer to cover the exposed semiconductor substrate. A thermal process is then carried out to diffuse dopants of the doped dielectric layer into the semiconductor substrate, thereby forming a doped region at the periphery of the active area in a channel width direction.

7 Claims, 9 Drawing Sheets

METHOD FOR ELIMINATING INVERSE NARROW WIDTH EFFECTS IN THE FABRICATION OF DRAM DEVICE

BACKGROUND OF INVENTION

1. Field of the Invention

The present invention relates generally to semiconductor fabrication processes and, more particularly, a semiconductor fabrication method for eliminating inverse narrow width effects in dynamic random access memory (DRAM) devices.

2. Description of the Prior Art

Trench-capacitor DRAM devices are known in the art. Typically, a trench-storage capacitor consists of a very-high-aspect-ratio contact-style hole pattern etched into the substrate, a thin storage-node dielectric insulator, a doped low-pressure chemical vapor deposition (LPCVD) polysilicon fill, and buried-plate diffusion in the substrate. The doped LPCVD silicon fill and the buried plate serve as the electrodes of the capacitor. A dielectric isolation collar in the upper region of the trench prevents leakage of the signal charge from the storage-node diffusion to the buried-plate diffusion of the capacitor.

Please refer to FIG. 1 and FIG. 2. FIG. 1 is a schematic planar view showing the layout of a prior art trench capacitor DRAM unit 1. FIG. 2 is an oblique cross-sectional view along line A' of FIG. 1. As shown in FIG. 1, the trench capacitor DRAM unit 1 comprises an access transistor 2 formed on an active area (AA) 10, and a trench capacitor 3 electrically connected to one terminal of the access transistor 2. The active area 10 such as a P-type silicon substrate is isolated by shallow trench isolation (STI) region 20. The access transistor 2 comprises a gate conductor (GC) 12, an N-type doped source 101, and an N-type doped drain 102. The N-type doped source 101 and the N-type doped drain 102 define a channel region 103, as indicated in dark area. The channel region 103 has a channel length "L" and a channel width "W". The N-type doped source 101 of the access transistor 2 is electrically connected to a bit line (not shown) through a contact 18. The N-type doped drain 102 of the access transistor 2 is electrically connected to a storage node (not shown) of the trench capacitor 3. As indicated in FIG. 2, a gate insulator 13 is disposed between the polysilicon gate 12 and the substrate 10.

There are several problems with the above-described prior art DRAM unit 1 as the dimension, either in channel length aspect or width aspect, of the DRAM cell shrinks to nano scale. As for channel length aspect, it is well known that short channel effects occur and a number of approaches have been addressed to solve such effects. However, as for shrunk channel width of the transistor, which results in problems such as STI corner effects, so-called inverse narrow width effects, and sub-threshold voltage leakage caused by sub-threshold voltage drop, there are few solutions for solving these problems, and thus becoming a bottleneck of further miniaturization of DRAM devices.

SUMMARY OF INVENTION

Accordingly, the primary object of the present invention is to provide a method for fabricating a DRAM device to solve the above-mentioned problems.

Another object of the present invention is to provide a method for fabricating a DRAM device to eliminating inverse narrow width effects.

To these ends, in one aspect of the invention, a method of fabricating a semiconductor DRAM device includes providing a first conductivity type semiconductor substrate; depositing a pad layer over the semiconductor substrate, the pad layer having an opening exposing the semiconductor substrate; etching the semiconductor substrate through the opening to form an isolation trench and an active island in the semiconductor substrate; depositing a non-doped sacrificial layer over the active island and the non-doped sacrificial layer filling the isolation trench; etching back the non-doped sacrificial layer to a depth of the isolation trench, thereby exposing a corner portion of the active island; depositing a dielectric layer doped with first conductivity type dopants over the remaining non-doped sacrificial layer and covering the exposed corner portion of the active island; and performing a thermal diffusion to diffuse the first conductivity type dopants of the dielectric layer into the corner portion of the active island to form a first conductivity type diffusion region at the periphery of the active island in a channel width direction.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The preferred embodiment in accordance with the present invention will be discussed in detail with reference to FIG. 3 to FIG. 9. It is understood that the type of semiconductor regions and device layout are chosen solely for illustration, and persons having ordinary skill in the art would recognize other alternatives, variations, and modifications.

Figure 1:
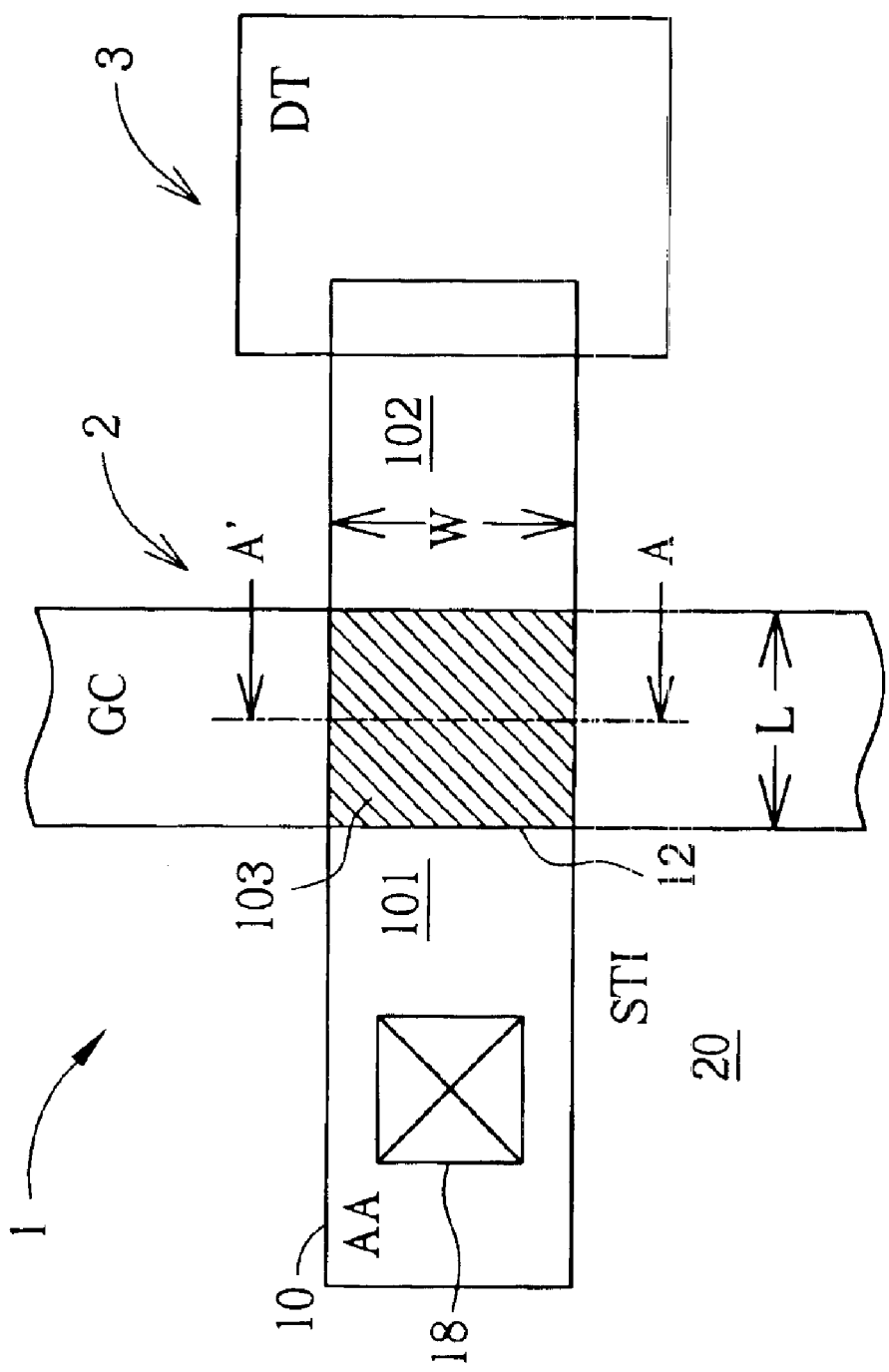
FIG. 1 is a schematic planar view showing the layout of a prior art trench capacitor DRAM unit 1.
Figure 2:
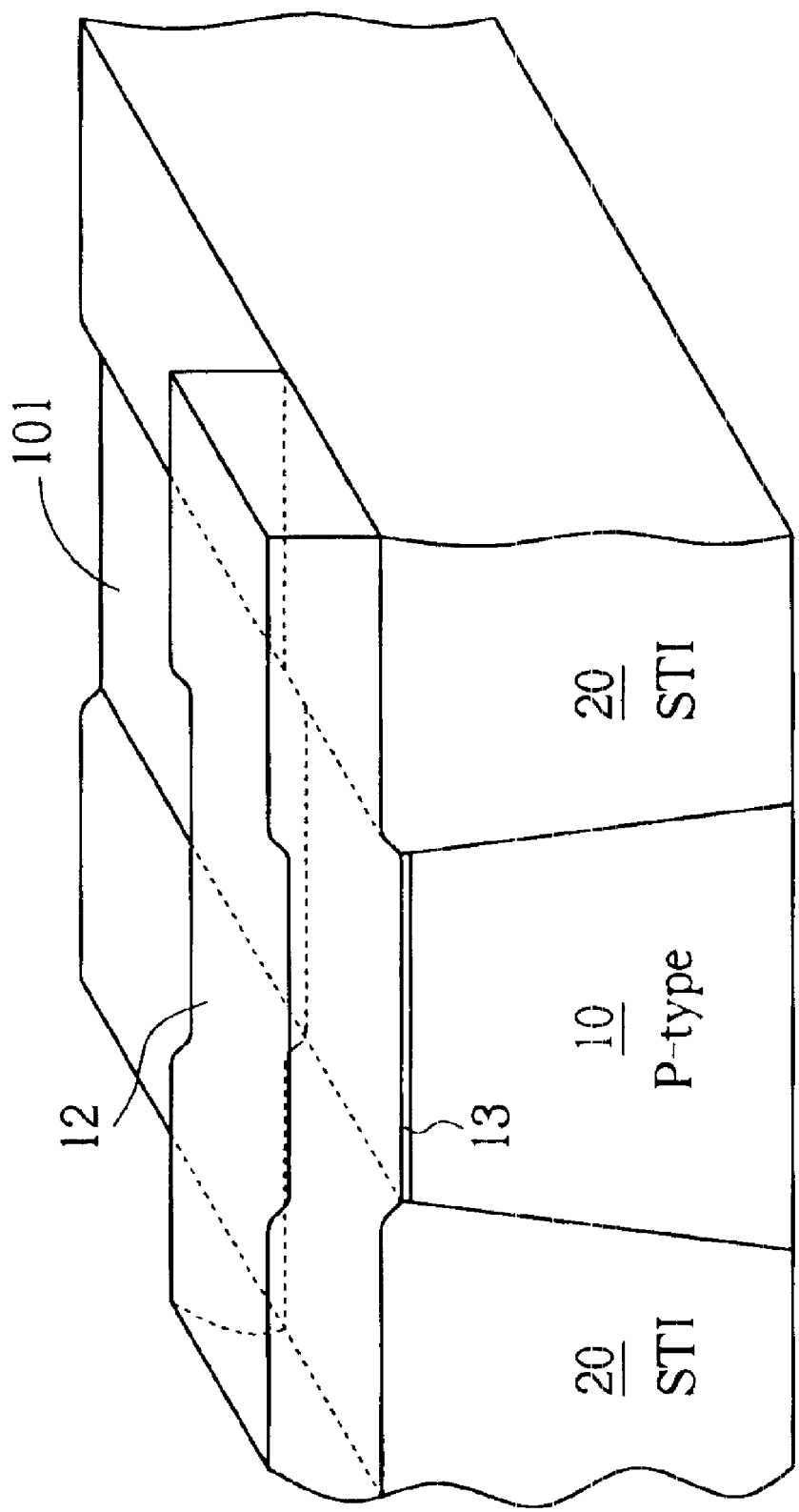
FIG. 2 is an oblique cross-sectional view along line AA' of FIG. 1.
Figure 3:
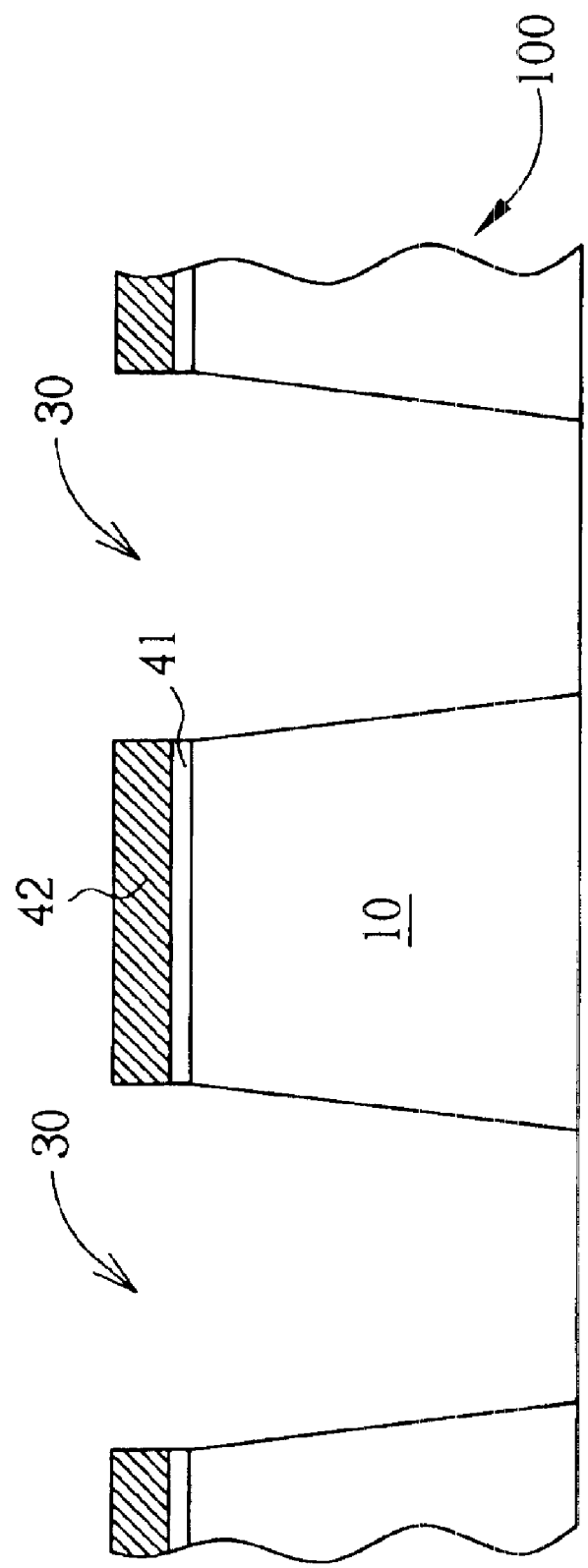
FIG. 3 to FIG. 8 are schematic cross-sectional diagrams illustrating the processes for making the trench capacitor DRAM device according to the preferred embodiment of the present invention.

Please refer to FIG. 3 to FIG. 8. FIG. 3 to FIG. 8 are schematic cross-sectional diagrams illustrating the processes for making the trench capacitor DRAM device according to the preferred embodiment of the present invention, in which like numeral references designate similar or corresponding elements, regions, and portions. As shown in FIG. 3, a P-type semiconductor substrate 100, in which a plurality of trench capacitors (not shown in this cross section) have been completed, is provided. A pad oxide 41 and a pad nitride 42 overlie the semiconductor substrate 100. Using the pad oxide 41 and pad nitride 42 as a hard mask, a conventional lithography and etching processes are carried out to etch into the semiconductor substrate 100 so as to form a plurality of isolation trenches 30 and active islands 10 concurrently.

Figure 4:
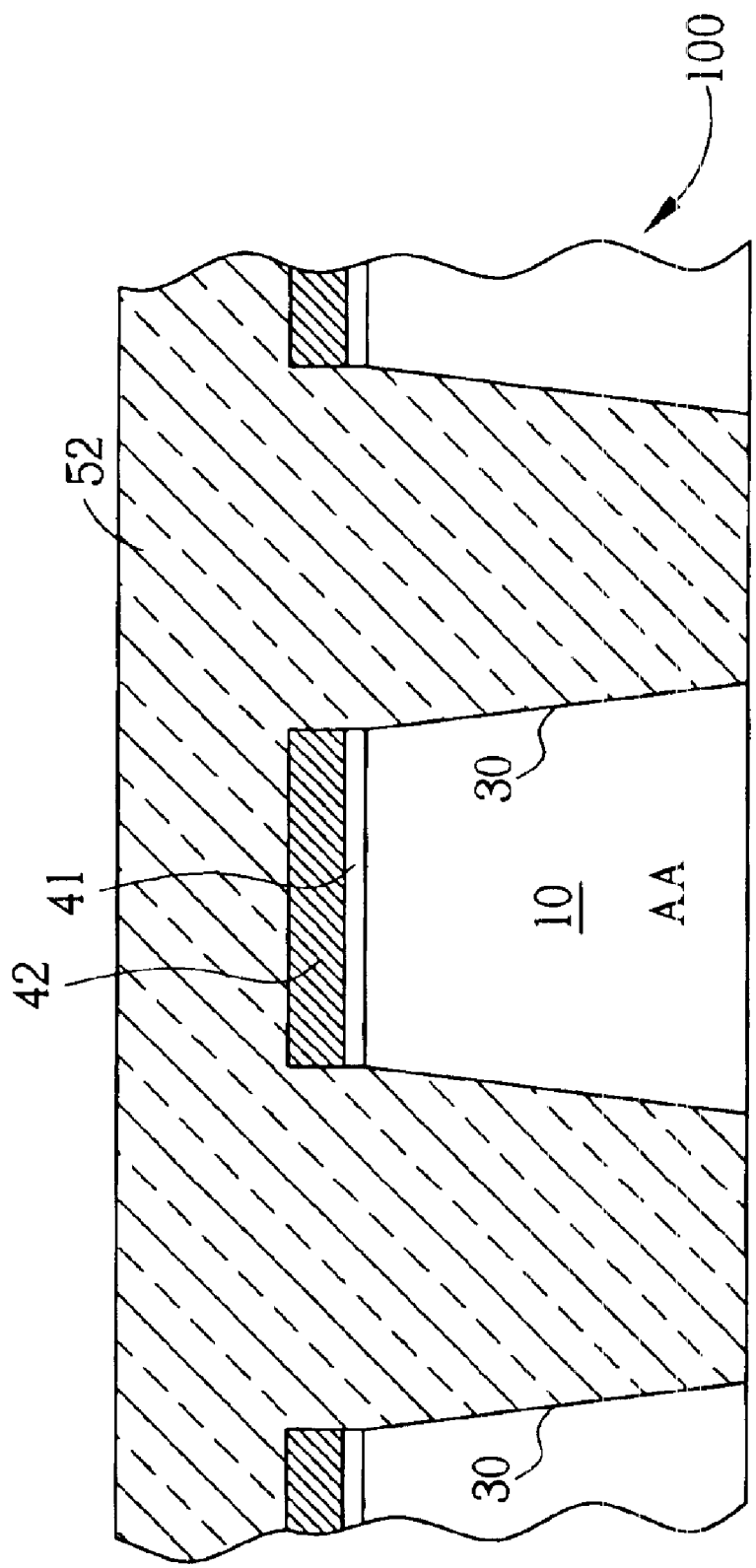

As shown in FIG. 4, a non-doped silicate glass (NSG) layer 52 is deposited on the semiconductor substrate 100 and fills the isolation trenches 30. The NSG layer 52 is deposited by methods known in the art, for example, chemical vapor deposition methods. It is noted that the NSG layer 52 made be replaced with other materials that can be etched selective to the pad nitride 42. After the deposition of the NSG layer 52, a chemical mechanical polishing (CMP) may be performed to obtain a planar surface.

Figure 5:
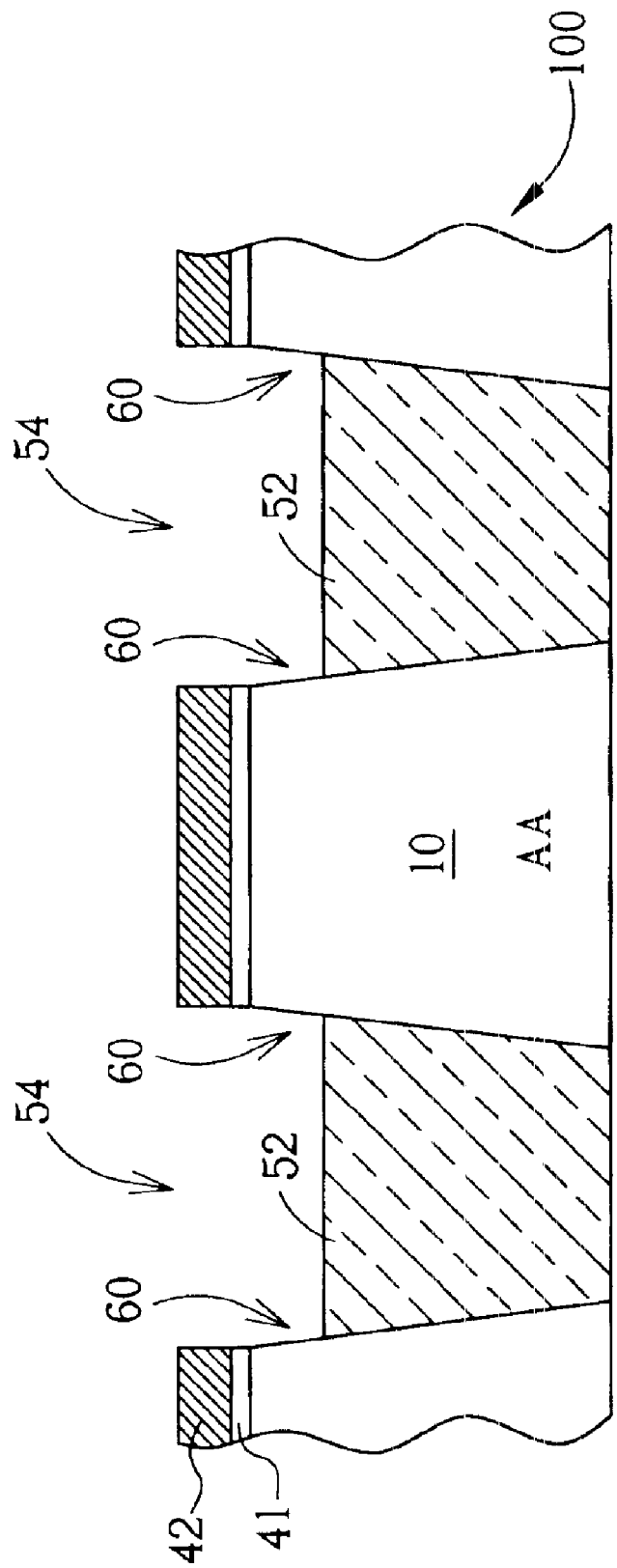

As shown in FIG. 5, an etching back process is carried out to etch the NSG layer 52 to a depth of the isolation trenches 30 so as to form recesses 54 and to expose corner portions 60 of the active islands 10.

Figure 6:
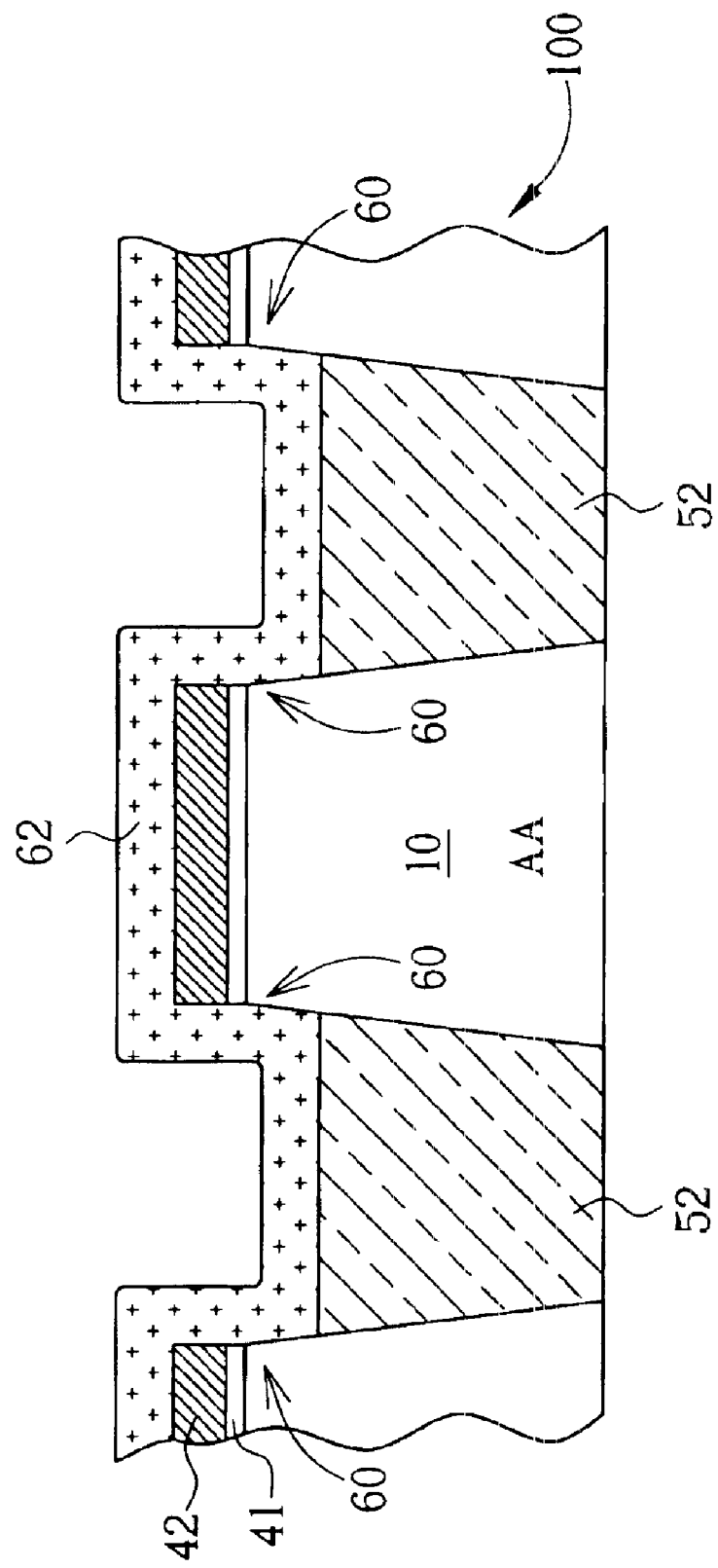

As shown in FIG. 6, a boron-doped material layer 62 is then deposited on the semiconductor substrate 100 and fills the recesses 54. Preferably, the boron-doped material layer 62 is a borosilicate glass (BSG). The exposed corner portions 60 of the active island 10 are contiguous with the boron-doped material layer 62.

Figure 7:
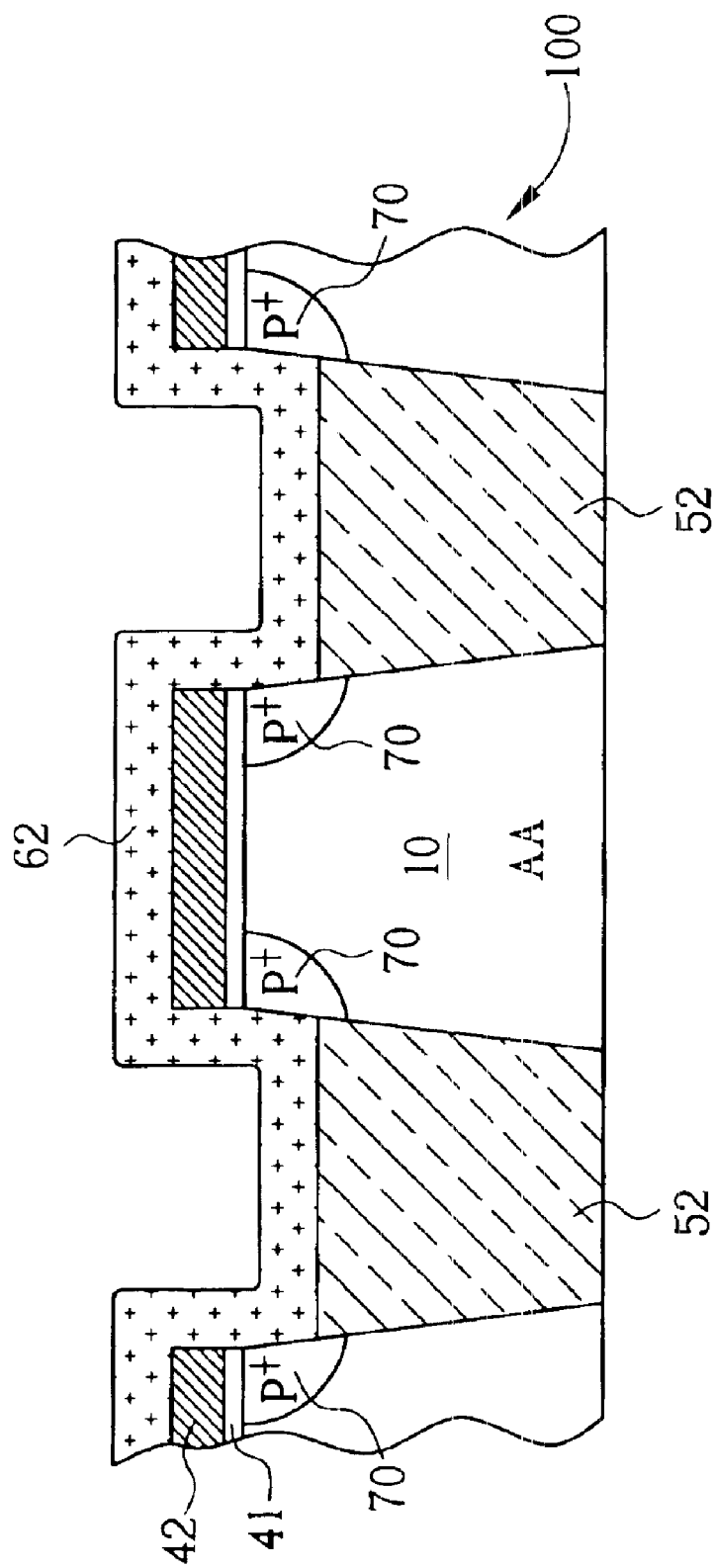

As shown in FIG. 7, a thermal diffusion process is performed to diffuse the dopants, i.e. boron, in the material layer 62 into the corner portions 60 of the active island 10, thereby forming $P^+$ diffusion regions 70 at both side of the active island 10 in the channel width direction. The $P^+$ diffusion region 70 has a doping concentration that is greater than the doping concentration of the P-type semiconductor substrate 100 by several orders in magnitude. The $P^+$ diffusion regions 70 in the channel width direction suppress inverse narrow width effects.

Figure 8:
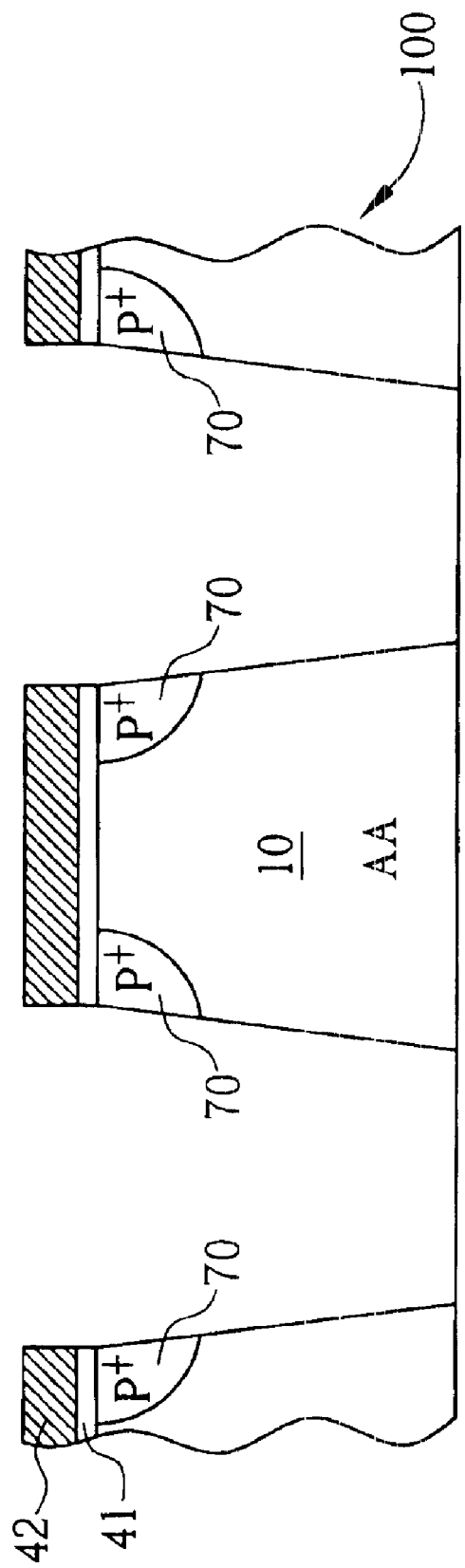
Figure 9:
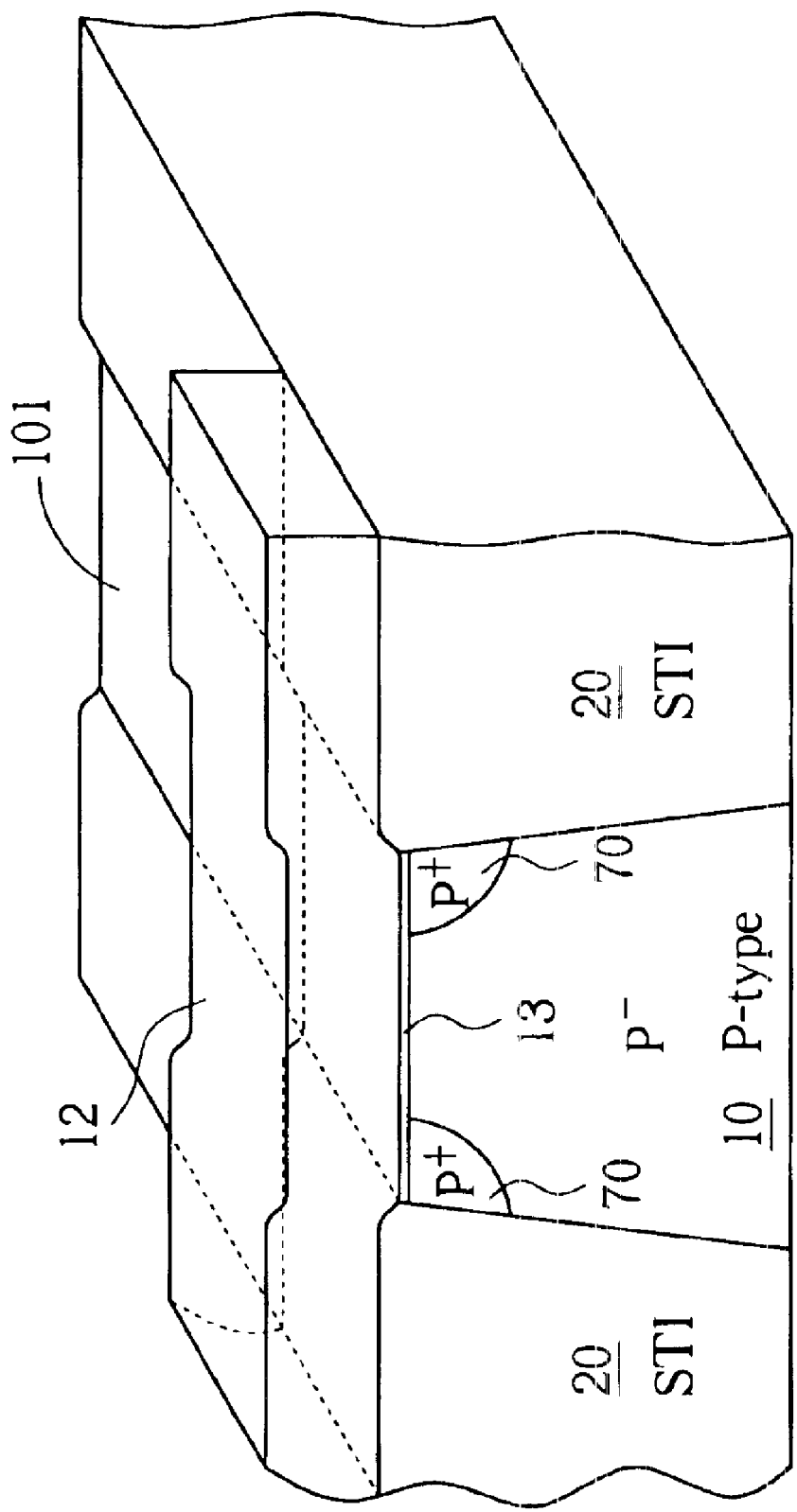
FIG. 9 is an oblique cross-sectional view specifically showing the $P^+$ diffusion regions formed at both side of the active island in the channel width direction.

As shown in FIG. 8, subsequently, the boron-doped material layer 62 and the NSG layer 52 are removed by methods known in the art, for example, buffered oxide etcher (BOE). The following steps for completing the STI isolation structure include STI gap fill material depositing, CMP, and pad oxide/nitride stripping. Finally, after the STI isolation structure is completed, gate oxide is grown on active area and word lines are then defined thereon. The resultant structure is shown in FIG. 9 in an oblique cross-sectional view. As shown in FIG. 9, a word line 12 passes the STI regions 20 and the gate oxide 13. The $P^+$ diffusion regions 70 are formed at both side of the active island 10 in the channel width direction.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for fabricating a semiconductor DRAM device, comprising:

providing a first conductivity type semiconductor substrate;

depositing a pad layer over the semiconductor substrate, the pad layer having an opening exposing the semiconductor substrate;

etching the semiconductor substrate through the opening to form an isolation trench and an active island in the semiconductor substrate;

depositing a non-doped sacrificial layer over the active island and the non-doped sacrificial layer filling the isolation trench;

etching back the non-doped sacrificial layer to a depth of the isolation trench, thereby exposing a corner portion of the active island;

depositing a dielectric layer doped with first conductivity type dopants over the remaining non-doped sacrificial layer and covering the exposed corner portion of the active island; and performing a thermal diffusion to diffuse the first conductivity type dopants of the dielectric layer into the corner portion of the active island to form a first conductivity type diffusion region at the periphery of the active island in a channel width direction.

2. The method of claim 1 wherein the first conductivity type semiconductor substrate has a first doping concentration, the first conductivity type diffusion region has a second doping concentration, and the second doping concentration is greater then the first doping concentration.

3. The method of claim 1 wherein the first conductivity type is P type.

4. The method of claim 1 wherein the pad layer comprises a pad oxide and a pad nitride.

5. The method of claim 1 wherein the non-doped sacrificial layer is a non-doped silicate glass (NSG) layer.

6. The method of claim 1 wherein the dielectric layer doped with first conductivity type dopants is a borosilicate glass (BSG) layer.

7. The method of claim 1 wherein after forming the first conductivity type diffusion region, the method further comprises the following steps:

removing the dielectric layer; and removing the non-doped sacrificial layer.

* * * * *